(12) United States Patent
Kosugi et al.

(10) Patent No.: US 8,889,337 B2
(45) Date of Patent: Nov. 18, 2014

(54) FILM FORMING METHOD, FILM FORMING APPARATUS AND PATTERN FORMING METHOD

(75) Inventors: Hitoshi Kosugi, Koshi (JP); Taro Yamamoto, Koshi (JP); Yoshiaki Yamada, Tokyo (JP); Yasuhito Saiga, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 1675 days.

(21) Appl. No.: 11/934,308

(22) Filed: Nov. 2, 2007

(65) Prior Publication Data

US 2008/0118861 A1     May 22, 2008

(30) Foreign Application Priority Data

Nov. 21, 2006    (JP) ................ 2006-313891

(51) Int. Cl.
    *G03F 7/09*        (2006.01)
    *B05C 11/02*     (2006.01)
    *G03F 7/20*        (2006.01)
    *G03F 7/11*        (2006.01)
    *H01L 21/67*      (2006.01)

(52) U.S. Cl.
    CPC ................ *G03F 7/2041* (2013.01); *G03F 7/11* (2013.01); *H01L 21/6708* (2013.01); *H01L 21/67115* (2013.01); *H01L 21/6715* (2013.01)
    USPC ................ 430/271.1; 430/273.1; 430/270.1; 430/394; 430/330

(58) Field of Classification Search
    USPC ................ 430/271.1, 273.1, 270.1, 330, 394
    See application file for complete search history.

(56) References Cited

U.S. PATENT DOCUMENTS

2005/0202347 A1\*   9/2005   Houlihan et al. ............. 430/311
2006/0177776 A1\*   8/2006   Matsunaga et al. ........... 430/322

FOREIGN PATENT DOCUMENTS

JP          2005-175079       6/2005
JP          2006-186112       7/2006
WO    WO 2005/029559 A1   3/2005

OTHER PUBLICATIONS

Office Action issued Mar. 1, 2011 in Japan Application No. 2006-313891 (With English Translation).

\* cited by examiner

*Primary Examiner* — Daborah Chacko Davis
(74) *Attorney, Agent, or Firm* — Oblon, Spivak, McClelland, Maier & Neustadt, L.L.P.

(57) ABSTRACT

Such a film forming method is provided that can prevent peeling of surface films including a resist film from a substrate during immersion exposure.
The film forming method includes the steps of forming surface films including a resist film and a protective film covering the resist film over a surface of a wafer, and forming an edge cap film by supplying an edge cap film material to at least a boundary portion including a periphery of the wafer and peripheries of the surface films such as the protective film.

4 Claims, 6 Drawing Sheets

FILM FORMING METHOD, FILM FORMING APPARATUS AND PATTERN FORMING METHOD

BACKGROUND OF THE INVENTION

1. Field of the Invention

The present invention relates to a film forming method and a film forming apparatus by which a film used for immersion exposure processing of performing exposure processing through a liquid is formed on a substrate such as a semiconductor substrate, and also relates to a pattern forming method that includes the above film forming method and forms a predetermined resist pattern on a substrate.

2. Description of the Background Art

In a manufacturing process of semiconductor devices, a photolithography technique is used for forming a circuit pattern on a semiconductor wafer. When the photolithography is used, the circuit pattern is formed through steps of forming a resist film (photoresist film) by applying a resist liquid over a semiconductor wafer, irradiating the resist film with light to expose the resist film corresponding to the circuit pattern, and then developing it.

Recently, there has been a tendency to increase packaging densities of semiconductor devices in view of improvement of operation speeds and others. In the photolithography technique, therefore, it has been required to miniaturize circuit patterns formed on semiconductor wafers. As a photolithography technique that achieves a high resolution of 45 nm node, there has been proposed immersion exposure, in which a liquid such as pure water having a higher refractivity than the air is supplied into a space between a wafer and an exposure projection lens employed, a wavelength of irradiation light passed through the projection lens is reduced owing to the refractivity of the liquid, and thereby a line width of the exposure is reduced (see International Laying-Open No. 2005-029559 brochure).

However, the immersion exposure processing is usually executed while forming a liquid current by supplying and drawing a liquid, and an air curtain is also formed in some cases. Therefore, a protective film (topcoat film) is applied over a film, e.g., a resist film formed on the wafer for protecting the resist film by preventing the resist film from being impregnated with the liquid and preventing elution of a resist ingredient from the resist film into the liquid. When edge portions of the protective film and others are not appropriately processed, the liquid current, the air current of the air curtain or the like may peel off the film from the wafer. When the film is peeled off, the peeled film changes into particles, which may contaminate an exposure device (e.g., the projection lens) and/or may cause a development defect.

SUMMARY OF THE INVENTION

The invention has been made in view of the above circumstances, and an object of the invention is to provide a film forming method and a film forming apparatus that can prevent peeling of a surface film including a resist film from a substrate during immersion exposure, to provide a pattern forming method including the above film forming method and to provide a computer-readable storage medium that stores a control program for executing the film forming method.

For achieving the above object, a first aspect of the invention provides a film forming method for forming, on a substrate, a film used for immersion exposure processing of applying exposure processing through a liquid, including the steps of forming, on a surface of the substrate, a surface film formed of a photoresist film or formed of the photoresist film and one or more kinds of films other than the photoresist film; and forming a peripheral film at least on a boundary portion including a periphery of the substrate and a periphery of the surface film.

According to the first aspect of the invention, the method may include a step of hardening the peripheral film. In this case, the method may include a step of heating the surface film prior to the peripheral film forming step, and the peripheral film forming step may be performed by heating the peripheral film at a temperature equal to or lower than the heating temperature of the surface film.

In the above first aspect of the invention, the surface film preferably has a protective film covering the photoresist film.

Further, in the above first aspect of the invention, when the surface film includes an anti-reflection film between the substrate and the photoresist film, it is preferable that the film forming method further includes a step of hardening the periphery of the anti-reflection film prior to the peripheral film forming step.

A second aspect of the invention provides a film forming apparatus for forming, on a substrate, a film used for immersion exposure processing of applying exposure processing through a liquid, including a surface film forming unit forming, on a surface of the substrate, a surface film formed of a photoresist film or formed of the photoresist film and one or more kinds of films other than the photoresist film; and a peripheral film forming unit forming a peripheral film at least on a boundary portion including a periphery of the substrate and a periphery of the surface film.

A third aspect of the invention provides a pattern forming method for forming a predetermined resist pattern on a surface of a substrate, including the steps of forming, on the surface of the substrate, a surface film formed of a photoresist film or formed of the photoresist film and one or more kinds of films other than the photoresist film; forming a peripheral film at least on a boundary portion including a periphery of the substrate and a periphery of the surface film; performing exposure on the photoresist film through a liquid to form a predetermined pattern after the formation of the photoresist film; removing the peripheral film after the exposure of the photoresist film; and developing the exposed photoresist film.

Further, a fourth aspect of the invention provides a computer-readable storage medium storing a control program to be run on a computer. The control program causes a computer to control a processing apparatus to perform the foregoing film forming method.

According to the invention, the surface film formed of the photoresist film or formed of the photoresist film and one or more kinds of films other than the photoresist film is formed on the substrate surface; and then the peripheral film is formed at least on the boundary portion including the periphery of the substrate and the periphery of the surface film. Therefore, the invention can prevent peeling of the surface film including the photoresist film from the substrate during the immersion exposure. Therefore, it is possible to avoid contamination of an exposure device, and a development quality can be improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the invention will be described below with reference to the drawings.

Figure 1:
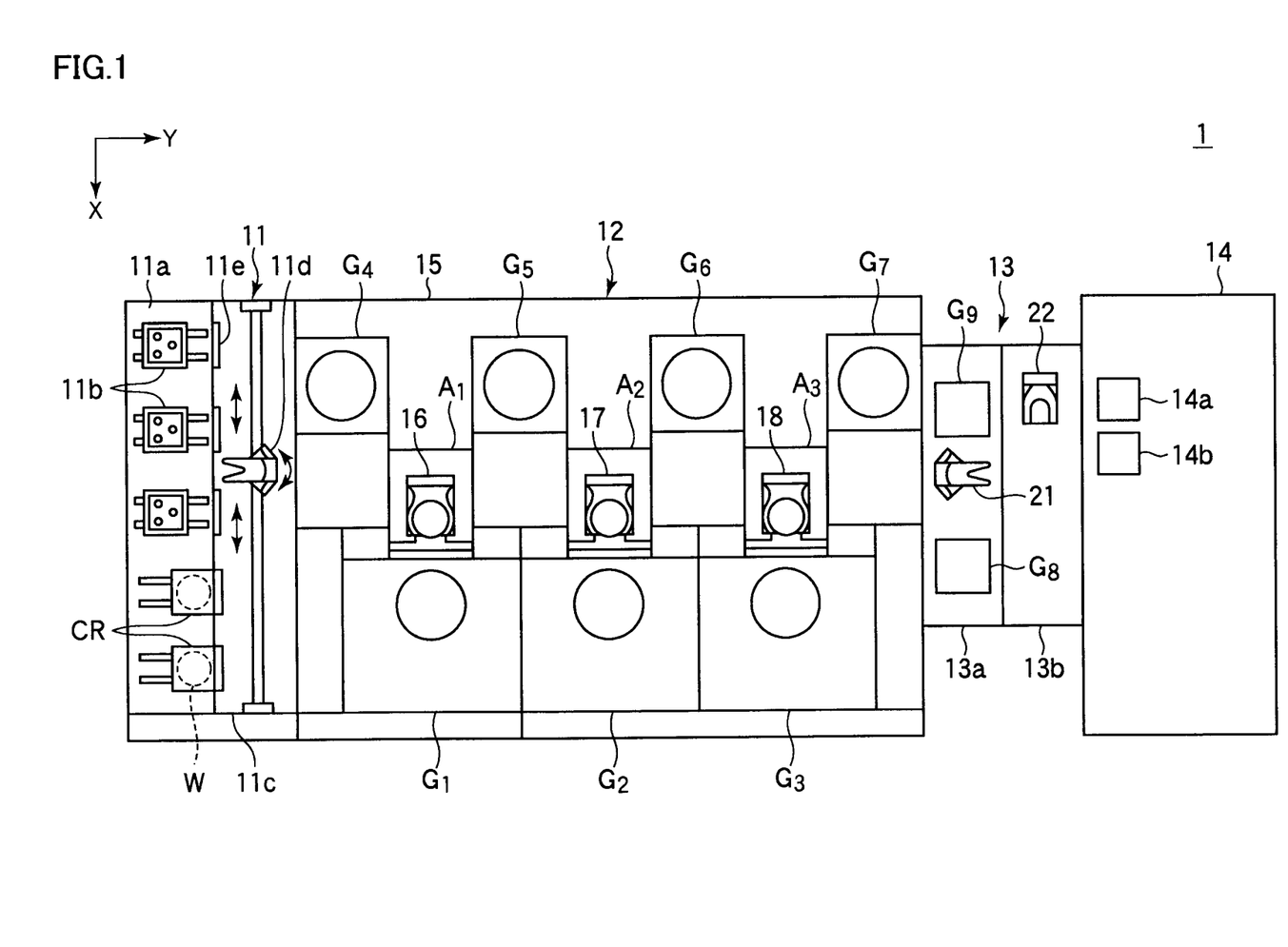
FIG. 1 is a schematic plan of a pattern forming apparatus that can execute a film forming method and a pattern forming method according to the invention.
Figure 2:
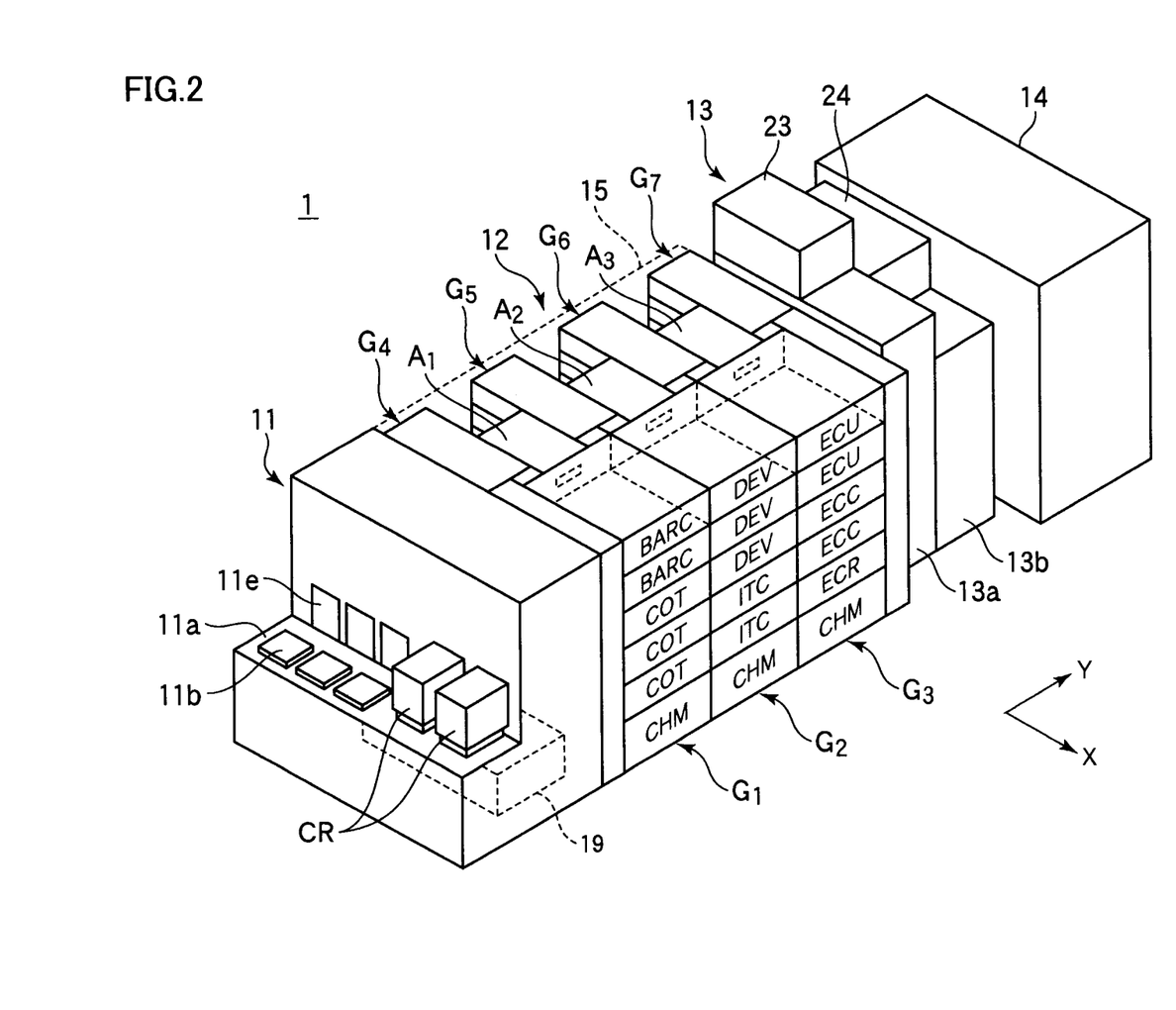
FIG. 2 is a schematic perspective view of a pattern forming apparatus.

FIG. 1 is a schematic plan of a pattern forming apparatus that can execute a film forming method and a pattern forming method according to the invention, and FIG. 2 is a schematic perspective view thereof.

A pattern forming apparatus 1 is configured to form a predetermined resist pattern on a semiconductor substrate, i.e., a wafer W, and includes a cassette station 11 that is a transfer station of wafer W, a processing station 12 having a plurality of processing units that perform predetermined processing on wafer W after and before exposure processing, an exposure device 14 performing the exposure processing on wafer W and an interface station 13 for transmitting wafer W between processing station 12 and exposure device 14. Cassette station 11, processing station 12, interface station 13 and exposure device 14 are serially arranged in this order in a lengthwise direction (Y direction) of pattern forming apparatus 1.

Cassette station 11 includes a cassette table 11a on which wafer cassettes (CR) each accommodating a plurality of (e.g., thirteen) wafers W are placed, and a wafer transferring unit 11c that is serially arranged in the Y direction with respect to cassette table 11a, and is located between wafer cassettes (CR) on cassette table 11a and a transition unit arranged in a fourth processing unit group $G_4$ of processing station 12 to be described later. A plurality of (e.g., five) positioning units 11b for positioning wafer cassettes (CR) are arranged cassette table 11a, and are aligned in a widthwise direction (X direction) of pattern forming apparatus 1. Each positioning unit 11b positions wafer cassette (CR) with its opening opposed to an open/close unit 11e formed at a wall of a casing of wafer transferring unit 11c. Wafer transferring unit 11c has a transferring pick 11d that is arranged inside its casing and can hold wafer W, and is configured to transfer wafer W between each wafer cassette (CR) on cassette table 11a and the transition unit by transferring pick 11d.

Processing station 12 is arranged inside a casing 15, is provided at its front side (lower side in FIG. 1) with first, second and third processing unit groups $G_1$, $G_2$ and G3 aligned in this order from the side of cassette station 11 toward the side of interface station 13, and is provided at its rear side (upper side in FIG. 1) with fourth, fifth, sixth and seventh processing unit groups $G_4$, $G_5$, $G_6$ and $G_7$ aligned in this order from the side of cassette station 11 toward the side of interface station 13. Also, processing station 12 has a first main transferring unit $A_1$ between fourth and fifth processing unit groups $G_4$ and $G_5$, a second main transferring unit $A_2$ between fifth and sixth processing unit groups $G_5$ and $G_6$, and a third main transferring unit $A_3$ between sixth and seventh processing unit groups $G_6$ and $G_7$.

First processing unit group $G_1$ is a stacked structure formed of, e.g., two bottom coating units (BARC) forming an anti-reflection film over a surface of wafer W for preventing light reflection during exposure and, e.g., three resist applying units (COT) forming a resist film (photoresist film) over the surface of wafer W. Second processing unit group $G_2$ is a stacked structure formed of, e.g., three developing units (DEV) performing development on the resist film formed over the surface of wafer W and, e.g., two top coating units (ITC) providing a protective film serving as a water repellent film against a liquid, which is used for immersion exposure to be described later, on the resist film formed over the surface of wafer W. Third processing unit group G3 is a stacked structure formed of, e.g., two edge hardening units (ECU) performing hardening processing on a periphery or edge of the anti-reflection film formed over wafer W, e.g., two edge cap forming units (ECC), i.e., peripheral film forming units that form an edge cap film (i.e., peripheral film) at a boundary portion including the periphery of wafer W and the periphery of the protective film formed over the surface of wafer W, and an edge cap removing unit (ECR) removing the edge cap film after the immersion exposure. Each of the units of the first to third processing unit groups $G_1$-G3 includes, e.g., a spin chuck that horizontally holds and spins wafer W, and is configured to perform predetermined processing while horizontally spinning wafer W by the spin chuck.

Fourth processing unit group $G_4$ has the transition unit for transiting wafer W between cassette station 11 and first main transferring unit $A_1$. Seventh processing unit group $G_7$ has a transition unit that transits wafer W between third main transferring unit $A_3$ and a first wafer transferring unit 21 (to be described later) of interface station 13. Fourth, fifth, sixth and seventh processing units $G_4$, $G_5$, $G_6$ and $G_7$ are formed stacked structures of various heating units such as an adhesion unit performing hydrophobic processing on wafer W, a pre-bake unit performing heating processing on wafer W coated with the resist, a post-bake unit performing heating processing on wafer W after the development and a post-exposure bake unit performing heating processing on exposed wafer W before the development.

First main transferring unit $A_1$ has a first main wafer transfer arm 16 that can hold wafer W and can selectively access each of the units in first, fourth and fifth processing unit groups $G_1$, $G_4$ and $G_5$. Second main transferring unit $A_2$ has a second main wafer transfer arm 17 that can hold wafer W and can selectively access each of the units in second, fifth and sixth processing unit groups $G_2$, $G_5$ and $G_6$. Third main transferring unit $A_3$ has a third main wafer transfer arm 18 that can hold wafer W and can selectively access each of the units in third, sixth and seventh processing unit groups G3, $G_6$ and $G_7$.

Chemical units (CHM) are arranged under first, second and third processing unit groups $G_1$, $G_2$ and G3 for supplying predetermined treatment liquids to respective units and collecting the treatment liquids used by the units.

Interface station 13 has a first interface station 13a on processing station 12 side and a second interface station 13b on exposure device 14 side. First interface station 13a is provided with a first wafer transferring unit 21 that is opposed to an opening at seventh processing unit group $G_7$ for transferring wafer W, and second interface station 13b is provided with a second wafer transferring unit 22 that can move in the X direction for transferring wafer W.

On the front side of first interface station 13a, there is arranged an eighth processing unit group $G_8$ that is a stacked structure formed of a periphery exposure device selectively performing the exposure on only the edge of wafer W for removing excessive resist over the peripheral portion of wafer W, an in-buffer cassette temporarily accommodating wafer W to be transferred to exposure device 14, an out-buffer cassette temporarily accommodating wafer W transferred from exposure device 14, and a washing unit washing the wafers before and after transference to and from exposure device 14. On the rear side of first interface station 13a, there is arranged a ninth processing unit group $G_9$ that is a stacked structure formed of, e.g., two high precision temperature control units controlling a temperature of wafer W with high precision.

First wafer transferring unit 21 can access each of the units in seventh, eighth and ninth processing units $G_7$, $G_8$ and $G_9$, and transfers wafer W between the units. Second wafer transferring unit 22 can access the washing unit in eighth processing unit group $G_8$ and each unit in ninth processing unit group $G_9$ as well as an in-stage 14a and an out-stage 14b (to be described later) of exposure device 14, and transfers wafer W between these units and stages.

Above first interface station 13a, there is arranged a draft regulator 23 that regulates drafts or air currents in first interface station 13a or interface station 13. Above second interface station 13b, a moistening unit 24 that moistens second interface station 13b or interface station 13 for preventing drying of wafer W transferred from exposure device 14.

Exposure device 14 is configured to perform the exposure on the resist film to form a predetermined pattern after immersing wafer W in a liquid such as pure water, and thus to perform the so-called immersion exposure. Exposure device 14 has in-stage 14a on which wafer W transferred from interface station 13 before the exposure is placed, and out-stage 14b on which exposed wafer W to be transferred to interface station 13 is placed.

Figure 3:
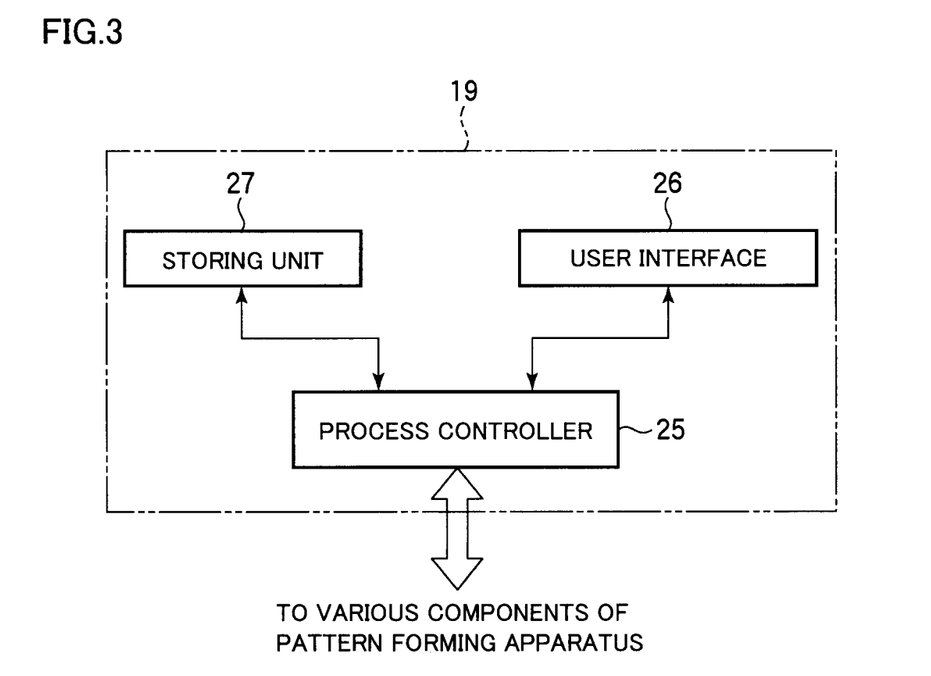
FIG. 3 conceptually shows a control unit arranged in the pattern forming apparatus.

As shown in FIG. 2, a control unit 19 that entirely controls pattern forming apparatus 1 is arranged under cassette station 11. As shown in FIG. 3, control unit 19 includes a process controller 25 provided with a microprocessor (computer), a user interface 26 that is connected to process controller 25, and is formed of components such as a keyboard to be operated by a process manager for entering commands and the like and thereby managing pattern forming apparatus 1 as well as a display that visualizes an operation state of pattern forming apparatus 1. Control unit 19 also includes a storing unit 27 that is connected to process controller 25, and stores recipes including control programs for implementing the processing by pattern forming apparatus 1 under the control of process controller 25 as well as processing condition data and the like. When necessary, an appropriate recipe in storing unit 27 is called up, e.g., according to an instruction provided from user interface 26, and is executed by process controller 25 so that pattern forming apparatus 1 performs the processing under the control of process controller 25. The recipes may be used by keeping them on a computer-readable storage medium such as a CD-ROM, a hard disk or a flash memory, and also may be used by transmitting them from another apparatus, e.g., via a dedicated line when necessary.

Then, processing steps executed by pattern forming apparatus 1 will be described.

FIGS. 4A-4I are cross sections of wafer W for illustrating the processing steps executed by pattern forming apparatus 1.

In pattern forming apparatus 1 having the above structure, transferring pick 11d takes out one wafer W from the wafer cassette (CR), and transfers it to the transition unit arranged in fourth processing unit group $G_4$ of processing station 12. According to a sequence in the recipe, first to third main transferring units $A_1$-$A_3$ successively transfers wafers W to the predetermined units in first to seventh processing unit groups $G_1$-$G_7$, and each wafer W undergoes a series of processing.

Figure 4A:
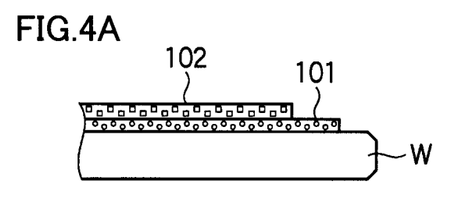
FIGS. 4A-4I are cross sections of a wafer for illustrating steps of processing by the pattern forming apparatus.
Figure 4B:
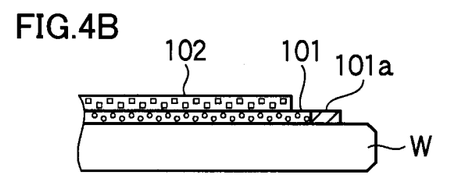

First, wafer W is transferred to the bottom coating unit (BARC), and an anti-reflection film 101 (see FIG. 4A) is formed over the surface of wafer W. Anti-reflection film 101 is formed in such a manner that a material of the anti-reflection film is supplied and spread over wafer W, and an excessive material of the anti-reflection film on the periphery is removed by a solvent. Then, wafer W is transferred to the resist applying unit (COT), and a resist film 102 is formed over the surface of wafer W (more specifically, the surface of anti-reflection film 101) as shown in FIG. 4A. Resist film 102 is formed in such a manner that a resist liquid is supplied and spread over wafer W, and excessive resist on the periphery is removed by a solvent. Subsequently, wafer W is transferred to the edge hardening unit (ECU), and a periphery 101a of anti-reflection film 101 is hardened as shown in FIG. 4B. This increases the adhesivity of anti-reflection film 101 to wafer W. The edge hardening unit (ECU) as well as the hardening processing by the edge hardening unit (ECU) will be described later in detail.

Figure 4C:
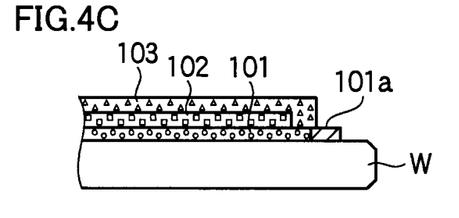
Figure 4D:
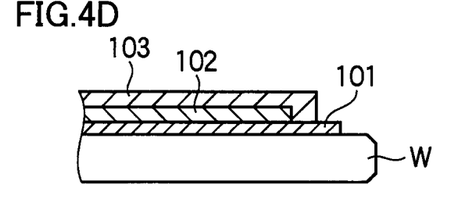

When the hardening processing by the edge hardening unit (ECU) ends, wafer W is transferred to the top coating unit (ITC), which forms a protective film 103 over the surface of wafer W (the surface of anti-reflection film 101) to cover resist film 102 as shown in FIG. 4C. Protective film 103 is formed in such a manner that a material of the protective film is supplied and spread over wafer W, and an excessive material of the protective film on the periphery is removed by a solvent. Anti-reflection film 101, resist film 102 and protective film 103 provide surface films formed over the surface of wafer W. The bottom coating unit (BARC), resist applying unit (COT) and top coating unit (ITC) provide a surface film forming unit forming the surface films over wafer W.

Figure 4E:
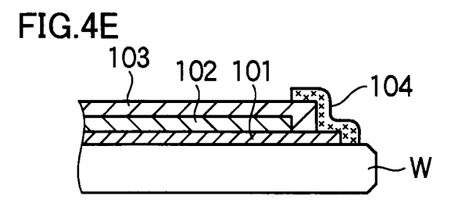
Figure 4F:
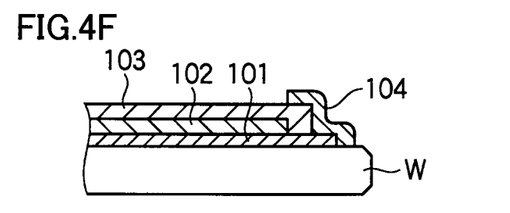

Then, wafer W is transferred to a pre-bake unit, and pre-bake processing is performed on wafer W to remove the solvent contained, e.g., in anti-reflection film 101, resist film 102 and protective film 103. Then, wafer W is transferred to the edge cap forming unit (ECC), and an edge cap film 104 is formed by supplying a material of the edge cap film to a boundary portion including the peripheries of wafer W, anti-reflection film 101 and protective film 103 as shown in FIG. 4E. Then, edge cap film 104 is heated to harden as shown in FIG. 4F. A heating temperature in this processing is set lower than a heating temperature of the foregoing pre-brake processing as well as heating temperatures of the post-exposure bake processing and the post-bake processing. For example, when the heating temperature of the post-exposure bake processing is in a range from 110 to 130 degrees C., the heating temperature of edge cap film 104 may be equal to or lower than 100 degrees C. and preferably equal to or lower than 90 degrees C.

The edge cap film material may be selected from among materials that have a high adhesivity to wafer W and films such as protective film 103, have water resistance and water repellency, are of the same kind as the resist and do not have a photosensitive base. The above material may be an acrylic resin or the like when a light source used for the immersion exposure to be described later is vacuum ultraviolet light such as argon fluoride (ArF) excimer laser light. When the light source used for the immersion exposure is far-ultraviolet light such as krypton fluoride (KrF) excimer laser light, polyimide (PI), polyhydrostyrene (PHS) or the like may be used. The edge cap forming unit (ECC) and the formation of edge cap film 104 by the edge cap forming unit (ECC) will be described later in detail.

Processing station 12 provides a film forming apparatus that forms the film for the immersion exposure processing over wafer W.

In the processing by first to seventh processing unit groups $G_1$-$G_7$, adhesion processing may be performed by an adhesion unit instead of forming the anti-reflection film by the bottom coating unit (BARC). The anti-reflection film may be formed over the resist film, and the protective film may be formed over the anti-reflection film.

When a series of the processing performed on wafer W by processing station 12 is completed, wafer W is transferred to the transition unit arranged in seventh processing unit $G_7$. Then, first wafer transferring unit 21 transfers wafer W successively to the peripheral exposure device, the in-buffer cassette and the washing unit of eighth processing unit group $G_8$ and the high-precision temperature control unit of ninth processing unit group $G_9$, and wafer W undergoes a series of processing. Then, second wafer transferring unit 22 transfers wafer W to in-stage 14a of exposure device 14, and exposure device 14 performs the immersion exposure on wafer W.

Figure 4G:
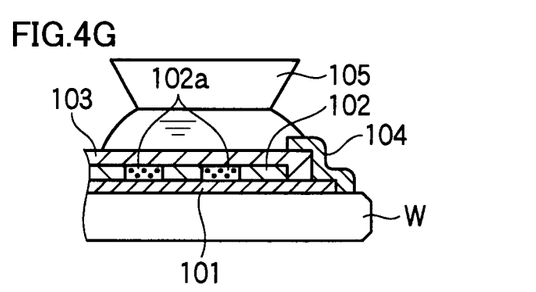

In exposure device 14, as shown in FIG. 4G, a liquid such as pure water is passed through a space between wafer W and an exposure projection lens 105 by supplying and drawing the liquid, and projection lens 105 performs the projection exposure through the liquid to form a pattern image 102a of a mask on resist film 102 at a predetermined magnification. When necessary, an air curtain is formed during the processing. The light source of the exposure is, e.g., far-ultraviolet light such as KrF excimer laser light or vacuum ultraviolet light such as ArF excimer laser light as already described. Since the peripheries of anti-reflection film 101 and protective film 103 are coated with edge cap film 104, it is possible to prevent peeling of these films due to a liquid current, an air current of the air curtain or the like even when the edge cut processing is not appropriately performed. Even when the periphery of resist film 102 is exposed from protective film 103, edge cap film 104 can cover resist film 102 so that peeling of resist film 102 can be reliably prevented.

When wafer W is placed on out-stage 14b after the immersion exposure by exposure device 14, second wafer transferring unit 22 transfers wafer W to the washing unit to wash wafer W. Then, first wafer transferring unit 21 transfers wafer W to the transition unit arranged in seventh processing unit group $G_7$, and first to third main transferring units $A_1$-$A_3$ transfers wafer W to the predetermined units in first to seventh processing unit groups $G_1$-$G_7$ according to the sequence in the recipe to perform a series of processing on wafer W.

Figure 4H:
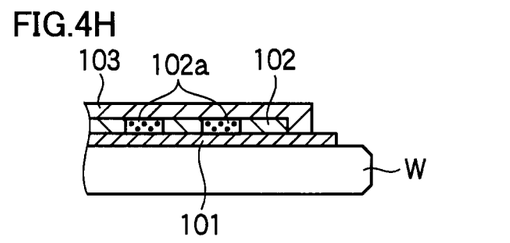
Figure 4I:
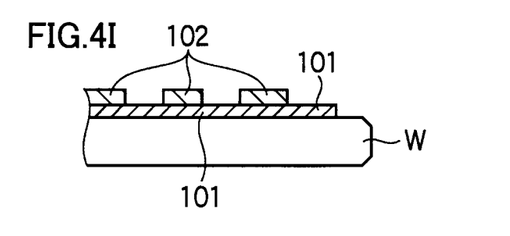

Wafer W is transferred to an edge cap removing unit (ECR), and edge cap film 104 is removed from wafer W as shown in FIG. 4H. The removal of edge cap film 104 is performed by supplying a solvent for the edge cap film to wafer W. Then, wafer W is transferred to the post-exposure bake unit, and is subjected to the post-exposure bake processing. Then, wafer W is transferred to the developing unit (DEV), and is subjected to the development. The development is performed by supplying a liquid developer onto wafer W. Thereby, as shown in FIG. 4I, protective film 103 and the portion of resist film 102 forming pattern image 102 are removed, and the predetermined resist pattern is formed over wafer W. Then, wafer W is transferred to the post-bake unit, and is subjected to the post-bake processing. Wafer W is transferred to the transition unit arranged in fourth processing unit group $G_4$, and then is transferred to the wafer cassette (CR) in cassette station 11.

In this embodiment, after the surface films such as resist film 102 and protective film 103 are formed over wafer W, edge cap film 104 is formed over the boundary portion between the periphery of wafer W and the surface films such as protective film 103, and the immersion exposure is performed on wafer W. Thereby, the peeling of the surface films such as protective film 103 can be prevented. Therefore, it is possible to avoid contamination of exposure device 14 and projection lens 105 due to the peeled film, and the development quality can be improved.

In this embodiment, after anti-reflection film 101 is formed over the surface of wafer W, only periphery 101a of anti-reflection film 101 is hardened in advance before the immersion exposure. Therefore, the adhesion of anti-reflection film 101 to wafer W can be increased. Accordingly, it is possible to prevent more reliably the peeling of anti-reflection film 101 in the immersion exposure processing, and thereby the development quality can be further improved.

Then, the edge hardening unit (ECU) will be described in detail.

Figure 5A:
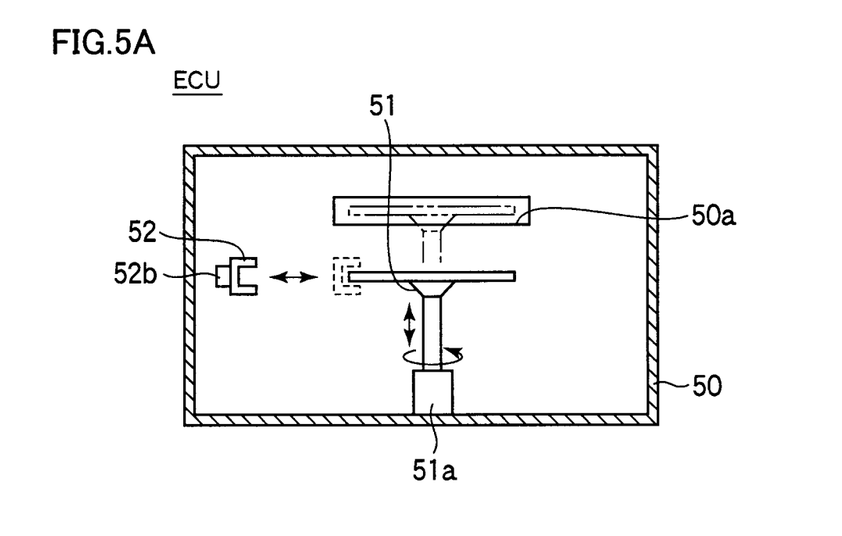
FIGS. 5A and 5B are schematic cross sections of an edge hardening unit forming the pattern forming apparatus.
Figure 5B:
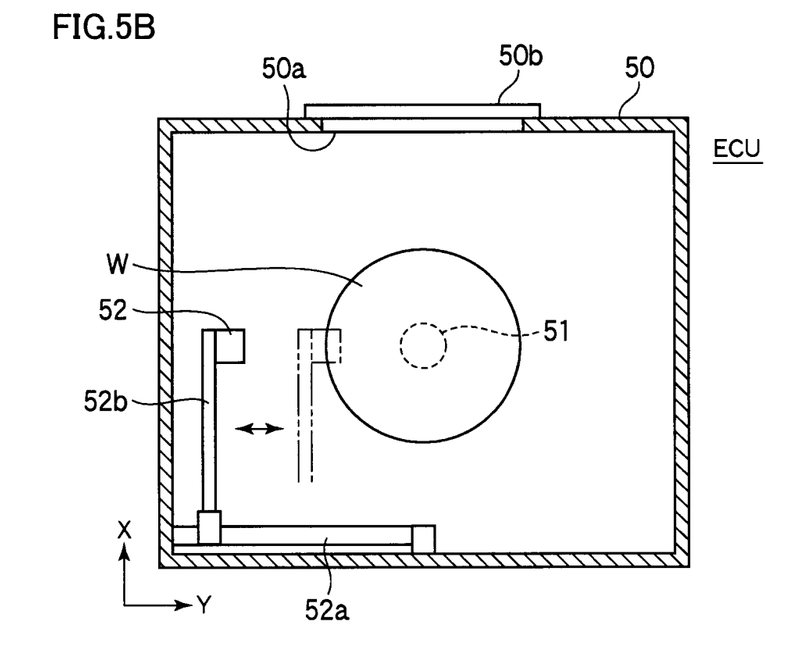

FIG. 5A is a schematic cross section viewed from the front side of the edge hardening unit (ECU) arranged in pattern forming apparatus 1. FIG. 5B is a schematic cross section viewed from the upper side.

The edge hardening unit (ECU) includes a chamber 50 accommodating wafer W, a spin chuck 51 that horizontally holds and spins wafer W within chamber 50, and a hardening mechanism 52 that hardens the periphery of anti-reflection film 101 (see FIGS. 4A-4I) on wafer W held by spin chuck 51.

At a side wall opposed to third main transferring unit $A_3$, chamber 50 is provided with an inlet/output 50a for carrying in and out wafer W as well as a shutter 50b that can close inlet/output 50a. Spin chuck 51 is vertically movable, and is configured to hold wafer W by applying a vacuum suction to a central portion of a lower (rear) surface of wafer W, and to spin horizontally wafer W thus held by a drive source 51a such as a motor. Hardening mechanism 52 has a substantially U-shaped section opening laterally for inserting a part of the periphery of wafer W into it, and includes a UV (ultraviolet) emitting mechanism (not shown) such as a lamp emitting ultraviolet rays to the periphery of the anti-reflection film on wafer F inserted thereinto. Hardening mechanism 52 is fixed to an arm 52b that is movable in the Y direction along a guide rail 52a, and is configured to move in the Y direction together with arm 52b.

In the edge hardening unit (ECU) of the above structure, third main wafer transfer arm 18 of third main transferring unit $A_3$ transfers wafer W through inlet/output 50a into chamber 50, and spin chuck 51 is raised to absorb and hold wafer W. Then, shutter 50b closes inlet/output 50a, and hardening mechanism 52 moves to insert a part of the periphery of wafer W. Spin chuck 51 spins wafer W at a predetermined speed, and the UV emitting mechanism of hardening mechanism 52 emits the ultraviolet rays to the periphery of the anti-reflection film on spinning wafer W. Thereby, the periphery of the anti-reflection film can be hardened substantially uniformly in the circumferential direction. When the hardening of the anti-reflection film is performed for a predetermined time, hardening mechanism 52 moves away from wafer W. Also, spin chuck 51 stops its spin, and shutter 50b opens inlet/output 50a. When third main wafer transfer arm 18 of third main transferring unit $A_3$ moved into chamber 50 through inlet/output 50a carries or holds wafer W, spin chuck 51 lowers away from wafer W. Thereafter, third main wafer transfer arm 18 transfers wafer W to the outside of chamber 50 through inlet/outlet 50a.

In the above description, the UV emitting mechanism is used as the mechanism for hardening the periphery of the anti-reflection film. However, a heating mechanism such as a heater may be used depending on the material of the anti-reflection film.

Then, the edge cap forming unit (ECC) will be described in detail.

Figure 6A:
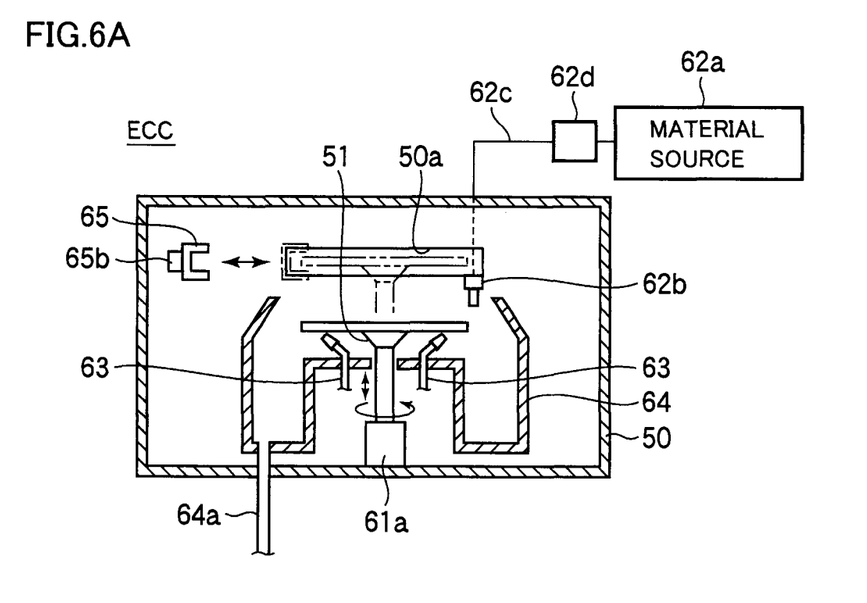
FIGS. 6A and 6B are schematic cross sections of an edge cap forming unit forming the pattern forming apparatus.
Figure 6B:
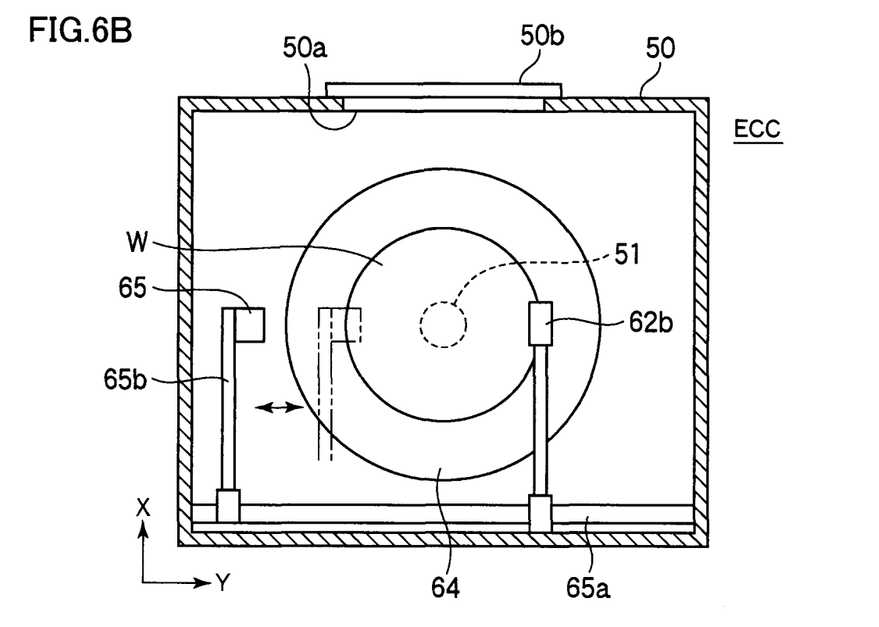

FIG. 6A is a schematic cross section viewed from a front side of the edge cap forming unit (ECC) arranged in pattern forming apparatus 1, and FIG. 6B is a schematic cross section viewed from an upper side.

The edge cap forming unit (ECC) includes chamber 50 accommodating wafer W, spin chuck 51 horizontally holding and spinning wafer W in chamber 50, a material supply mechanism 62 supplying a material of the edge cap film to the periphery of wafer W (i.e., a boundary portion including the periphery of wafer W and the peripheries of anti-reflection film 101 and protective film 103 (see FIGS. 4A-4I)), a solvent nozzle 63 supplying a solvent for removing an excessive material of the edge cap film adhered onto the periphery on the rear side of wafer W, a cup body 64 receiving the material of the edge cap film and the solvent that flow down or spin off from wafer W held by spin chuck 51, and a hardening mechanism 65 that hardens edge cap film 104 (see FIGS. 4A-4I) on wafer W held on spin chuck 51. Chamber 50 and spin chuck 51 of the edge cap forming unit (ECC) have substantially the same structures as those of edge hardening unit (ECU), and bear the same reference numbers. Description thereof is not repeated.

Material supply mechanism 62 has a material source 62a for supplying the edge cap material, a material nozzle 62b supplying the edge cap material provided from material source 62a downward onto the periphery of wafer W held by spin chuck 51, a carrying pipe 62c carrying the edge cap material from material source 62a to material nozzle 62b, and a flow rate regulator 62d such as a valve that regulates a flow rate of the edge cap material flowing through carrying pipe 62c. Material nozzle 62b has a base end connected to a guide rail 65a arranged in chamber 50 and extending in the Y direction so that it can move in the Y direction along guide rail 65a, and can also move upward and downward. Solvent nozzles 63 are located under wafer W held by spin chuck 51, and are located, e.g., at a plurality of circumferentially spaced positions, respectively. Each solvent nozzle 63 is directed upward and is inclined toward a radially outer side of wafer W so that the solvent supplied upward therefrom reaches the lower side of the periphery of wafer W.

Cup body 64 has an open top, and is configured to surround wafer W when spin chuck 51 holding wafer W lowers. Cup body 64 has a tapered upper portion converging upward so that it can accept or receive directly the solvent discharged from solvent nozzles 63 together with the edge cap film material and the solvent that flow down or spin off from wafer W. Cup body 64 is connected at its bottom wall to a collection line 64a collecting the received edge cap film material and the received solvent so that the edge cap film material and the solvent that are collected from cup body 64 into collection line 64a are reused or abandoned.

Hardening mechanism 65 has a substantially U-shaped section opening laterally so that a part of the periphery of wafer W held by a spin chuck 61 in a raised position can be inserted into it, and has a heating mechanism (not shown) such as a heater that heats the edge cap film on inserted wafer W. Hardening mechanism 65 is attached to an arm 65b that is movable in the Y direction along guide rail 65a, and is configured to move in the Y direction together with arm 65b.

In the edge cap forming unit (ECC) having the above structure, third main wafer transfer arm 18 of third main transferring unit $A_3$ transfers wafer W into chamber 50 through inlet/output 50a, and then spin chuck 51 rises and absorbs wafer W so that spin chuck 51 holds wafer W. Then, shutter 50b closes inlet/output 50a, and spin chuck 51 lowers to surround wafer W by cup body 64. Material supply mechanism 62 supplies the edge cap material to the periphery of wafer W (i.e., a boundary portion including the periphery of wafer W and the peripheries of the anti-reflection film and the protective film) while spinning wafer W by spin chuck 51. Also, during the above spinning of wafer W, solvent nozzle 63 supplies the solvent to remove an excessive material of the edge cap adhered onto the rear side of wafer W. Thereby, the edge cap film is formed over the boundary portion including the periphery of wafer W and the peripheries of the anti-reflection film and the protective film. Then, material supply mechanism 62 stops the supply of the edge cap material, and solvent nozzle 63 stops the supply of the solvent. In this state, spin chuck 51 spins wafer W to dry the edge cap film to a certain extent.

When the edge cap film dries to a certain extent, spin chuck 51 rises. Then, hardening mechanism 65 moves to insert a part of the periphery of wafer W into it. Then, a state in which spin chuck 51 spins wafer W at a predetermined speed is kept, and the heating mechanism of hardening mechanism 65 heats the edge cap film at a temperature, e.g., not exceeding 100 degrees C., and preferably 90 degrees C. Thereby, the edge cap film can be hardened substantially uniformly in the circumferential direction. After the hardening of the edge cap film continues for a predetermined time, hardening mechanism 65 moves away from wafer W, spin chuck 51 stops the spinning and shutter 50b opens inlet/output 50a. When third main wafer transfer arm 18 of third main transferring unit $A_3$ enters into chamber 50 through inlet/output 50a to carry or hold wafer W, spin chuck 51 lowers away from wafer W. Thereafter, third main wafer transfer arm 18 transfers wafer W through inlet/output 50a to the outside of chamber 50.

By using the edge cap forming unit (ECC) having the above structure, the formation of the edge cap film and the subsequent hardening of the edge cap film can be performed in the same chamber 50 so that the apparatus can have a compact structure.

In the above structure, the heating mechanism such as a heater is used as the mechanism for hardening the edge cap film. However, a UV emitting mechanism may be used depending on the material of the edge cap film.

The invention is not restricted to the above embodiment, and various modifications can be employed. In the above embodiments, the protective film is formed over the surface of the resist film, and the edge cap film is formed over the boundary portion including the peripheries of the protective film and the wafer. However, this is not restrictive. The protective film may not be formed over the surface of the resist film, and the edge cap film may be formed directly over the boundary portion including the peripheries of the resist film and the wafer.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A film forming method for forming, on a substrate, a film used for immersion exposure processing of applying exposure processing through a liquid, comprising the steps of:
    forming an anti-reflection film on a surface of said substrate;
    forming a photoresist film on a surface of said anti-reflection film;
    removing excess photoresist on a circumferential periphery of the photoresist film surface;
    rotating the substrate with the anti-reflection film thereon, at a predetermined speed to perform a hardening process using ultraviolet rays that exposes a circumferential periphery of the anti-reflection film on the substrate to the ultraviolet rays so as to allow the anti-reflection film to be substantially uniformly hardened only at the circumferential periphery of said anti-reflection film;

heating the substrate to harden a surface film, the surface film including each of said anti-reflection film and said photoresist film;

supplying an edge cap peripheral film forming material, configured of a resist material having a photosensitive base removed therefrom, in a liquid state to the rotating substrate, the material, excluding a portion thereof located at an edge of the substrate, is removed using a solvent, to form an edge cap peripheral film only on a circumferential periphery of the surface film and on a boundary portion of the substrate located between a periphery of said substrate and the periphery of the surface film; and hardening said edge cap peripheral film.

2. The film forming method according to claim 1, wherein said edge cap peripheral film forming step is performed by heating the edge cap peripheral film at a temperature equal to or lower than the heating temperature of the surface film.

3. The film forming method according to claim 2, wherein said surface film further has a protective film covering said photoresist film.

4. The film forming method according to claim 1, wherein said surface film further has a protective film covering said photoresist film.

* * * * *